US009419091B1

(12) United States Patent
Leobandung

(10) Patent No.: US 9,419,091 B1
(45) Date of Patent: Aug. 16, 2016

(54) TRENCHED GATE WITH SIDEWALL AIRGAP SPACER

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/613,667

(22) Filed: Feb. 4, 2015

(51) Int. Cl.
*H01L 29/786* (2006.01)
*H01L 29/51* (2006.01)
*H01L 29/66* (2006.01)

(52) U.S. Cl.
CPC ........ *H01L 29/515* (2013.01); *H01L 29/66742* (2013.01); *H01L 29/786* (2013.01)

(58) Field of Classification Search
CPC ............ H01L 29/515; H01L 29/66742; H01L 29/786
See application file for complete search history.

(56) References Cited

U.S. PATENT DOCUMENTS

| 6,051,861 | A | 4/2000 | Togo |
| 6,228,763 | B1 | 5/2001 | Lee |
| 6,238,987 | B1 | 5/2001 | Lee |
| 7,691,712 | B2 * | 4/2010 | Chidambarrao ........... H01L 21/823807 257/355 |
| 7,994,040 | B2 * | 8/2011 | Chi ........... H01L 29/665 257/E21.435 |
| 8,637,384 | B2 | 1/2014 | Ando et al. |
| 8,637,930 | B2 * | 1/2014 | Ando ........... H01L 29/785 257/347 |
| 8,778,749 | B2 | 7/2014 | Pachamuthu et al. |
| 2001/0045608 | A1 * | 11/2001 | Tseng ........... H01L 29/41775 257/410 |
| 2010/0102363 | A1 | 4/2010 | Hause et al. |
| 2012/0061763 | A1 | 3/2012 | Lee et al. |
| 2013/0130489 | A1 | 5/2013 | Horak et al. |

FOREIGN PATENT DOCUMENTS

| CN | 103515211 A | 1/2014 |
| JP | 07022310 A | 1/1995 |
| JP | 2002270821 A | 9/2002 |
| KR | 1020080086183 A | 9/2008 |

* cited by examiner

*Primary Examiner* — Jarrett Stark
(74) *Attorney, Agent, or Firm* — Steven F. McDaniel

(57) ABSTRACT

A method for fabricating a semiconductor device may include receiving a device substrate comprising a channel layer and a source or drain layer, forming a gate trench within the source or drain layer of the device substrate, depositing a gate dielectric layer and one or more additional gate layers onto the bottom and sidewalls of the gate trench, and removing a substantial portion of at least the gate dielectric layer from the sidewalls of the gate trench to form a left and a right sidewall airgap adjacent to the sidewalls of the gate trench. A corresponding semiconductor device may include a device substrate comprising a channel layer and a source or drain layer, a gate trench formed within the source or drain layer of the device substrate and a sidewall airgap formed adjacent to the sidewalls of the gate trench.

10 Claims, 6 Drawing Sheets

TRENCHED GATE WITH SIDEWALL AIRGAP SPACER

BACKGROUND OF THE INVENTION

The present invention relates generally to semiconductor devices and device fabrication and more particularly to reducing leakage current in such devices.

One of the challenges in scaling transistors to smaller geometries is providing spacers between the gate and the source and drain on each side of the gate that isolate the gate from the source and drain of the transistor.

SUMMARY

A semiconductor device (i.e., apparatus) and a method for fabricating the semiconductor device are disclosed herein. In one embodiment, the method includes receiving a device substrate comprising a channel layer and a source or drain layer, forming a gate trench within the source or drain layer of the device substrate, depositing a gate dielectric layer and one or more additional gate layers onto the bottom and sidewalls of the gate trench, and substantially removing at least the gate dielectric layer from the sidewalls of the gate trench to form a left and a right sidewall airgap adjacent to the sidewalls of the gate trench.

In one embodiment, the semiconductor device includes a device substrate comprising a channel layer, and a source or drain layer, a gate trench formed within the source or drain layer of the device substrate that partitions the source or drain layer into a source and a drain, a gate dielectric layer and one or more additional gate layers formed within the gate trench, and a sidewall airgap formed adjacent to the sidewalls of the gate trench by removing a substantial portion of at least the gate dielectric layer from the sidewalls of the gate trench.

DETAILED DESCRIPTION

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

Figure 1:
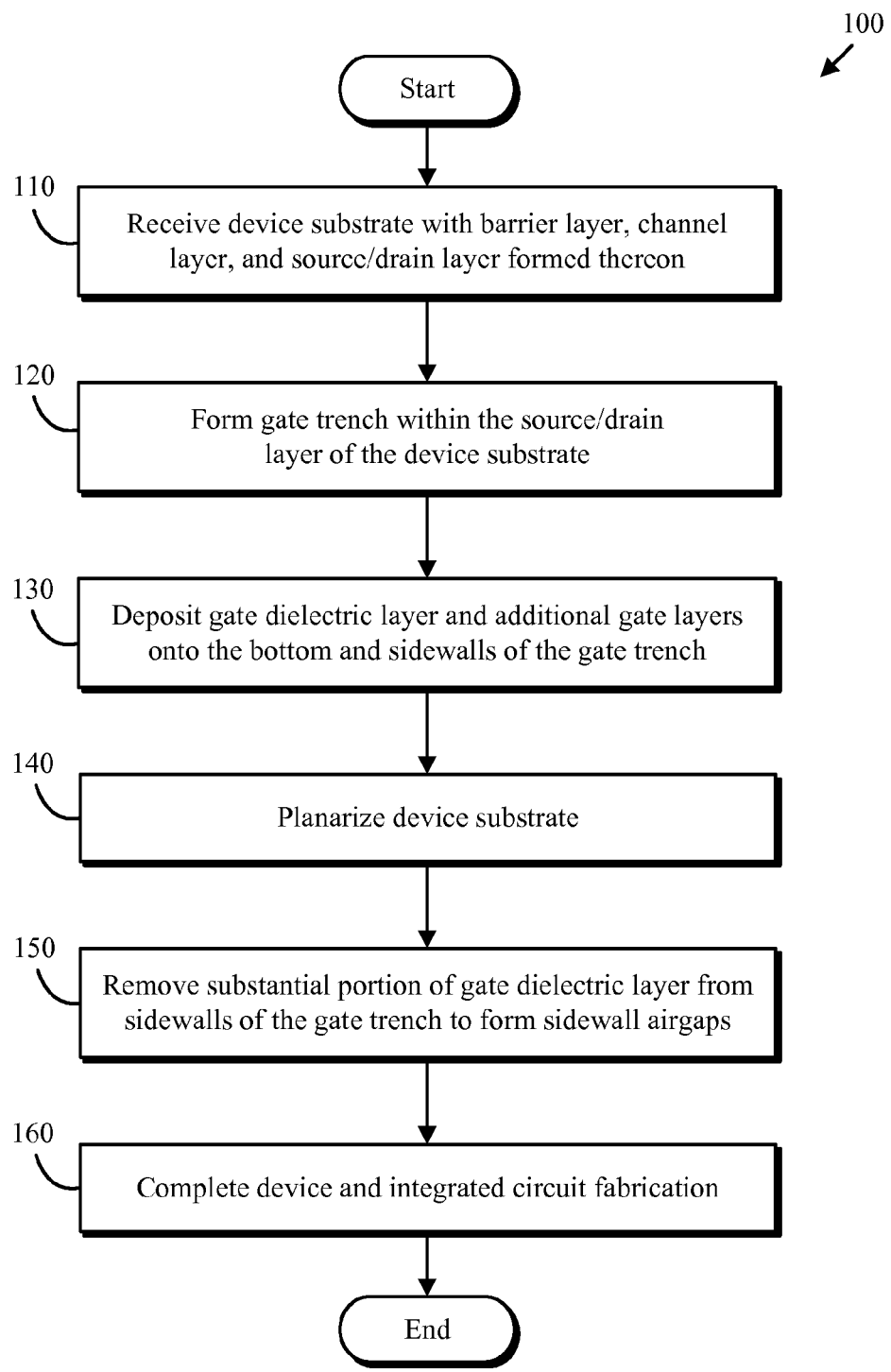
FIG. 1 is a flowchart depicting one embodiment of a method for fabricating a semiconductor device.

The embodiments disclosed herein provide an airgap spacer that isolates the gate from the source and drain of a transistor and thereby reduces parasitic capacitance. For example, FIG. 1 is a flowchart depicting one embodiment of a method 100 for fabricating a semiconductor device. As depicted, the method includes receiving (110) a device substrate, forming (120) a gate trench, depositing (130) a gate dielectric layer and additional gate layers onto the bottom and sidewalls of the gate trench, planarizing (140) the device substrate, removing (150) a substantial portion of at least the gate dielectric layer from sidewalls of the gate trench, and completing (160) device and integrated circuit fabrication. The method 100 may be used to fabricate trench gate semiconductor devices with airgap spacers formed on the sidewalls of the trench.

Receiving (110) a device substrate may include receiving a device substrate with a channel layer, and a source/drain layer formed thereon. In some embodiments, the device substrate also includes a barrier layer and the device substrate is formed over a bulk substrate. Forming (120) a gate trench may include etching one or more trenches into the source/drain layer of the device substrate that partitions the source/drain layer into source regions and drain regions.

Depositing (130) a gate dielectric layer and additional gate layers onto the bottom and sidewalls of the gate trench may include using chemical vapor deposition, atomic layer deposition, molecular beam epitaxy, or other deposition methods, to deposit the various layers onto the bottom and sidewalls of the trenches. In certain embodiments, the photoresist used to pattern the trenches during the forming operation 120 is kept in place for the depositing operation 130 to prevent depositing the materials onto the source/drain layer.

Planarizing (140) the device substrate may include conducting a chemical mechanical polishing process to remove materials that are outside or above the trenches. Removing (150) a substantial portion of at least the gate dielectric layer from sidewalls of the gate trench may include conducting a low energy selective directional etch that etches away at least the gate dielectric layer from the sidewalls of the gate trench without harming or substantially removing at least one of the additional gate layers.

Completing (160) device and integrated circuit fabrication may include conducting additional steps and processes to provide packaged integrated circuits including adding interconnection layers and elements that interconnect the semiconductor devices into circuits.

Figure 2:
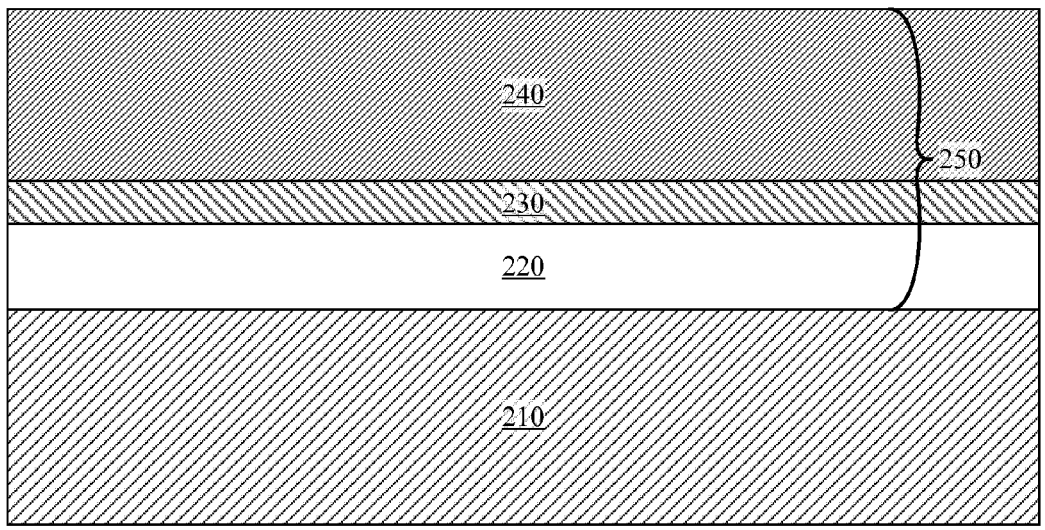
FIGS. 2-3, 4A-4C, 5, 6A, 6B, 7A and 7B are cross-sectional view illustrations of a semiconductor device at various stages of processing for one embodiment of the method of FIG. 1.

FIGS. 2-3, 4A-4C, 5, 6A, 6B, 7A and 7B are cross-sectional view illustrations of a semiconductor device at various stages of processing for one embodiment of the method of FIG. 1. As shown in FIG. 2, a bulk substrate 210 such as a wafer may be provided with a barrier layer 220, channel layer 230, and a source/drain layer 240. The barrier layer 220, the channel layer 230, and a source/drain layer 240 may collectively function as a device substrate 250 for the manufacture of semiconductor devices. Although fabrication of a single semiconductor device is shown in the Figures, many semiconductor devices may be simultaneously fabricated.

The bulk substrate 210 may be made of a semiconductor material including a compound semiconductor material. The bulk substrate material may be the same as, or different than, the material used to form the channel layer 230. In some embodiments, the bulk substrate comprises a III-V compound material such as InP, InGaAs, or GaAs. In other embodiments, the bulk substrate comprises a II-VI compound material such as ZnO. In yet other embodiments, the bulk substrate comprises a group IV material such as Si or Ge.

The barrier (i.e., isolation) layer 220 isolates the (surface) regions where the semiconductor devices are fabricated. In some embodiments, the barrier layer is made of a semiconductor material with a lattice constant that is similar to the bulk substrate but with a larger bandgap. For example, for a GaAs bulk substrate the barrier layer may be formed from AlAs. For an InGaAs substrate, the barrier layer may be formed from InAlAs. In other embodiments, the barrier layer is formed from an oxide such as $SiO_2$, HfO, ZrO, TaO, and the like. In some embodiments, the barrier layer 220 is omitted and the channel layer 230 resides directly on the bulk substrate 210.

The channel layer 230 may be made of an undoped semiconductor material that will function effectively as a channel region of a semiconductor device. In some embodiments, the channel layer 230 is epitaxially grown. For example, the channel layer may be formed of epitaxially grown Si, Ge, SiGe, a II-VI material, or InGaAs. The source/drain layer 240 may also be epitaxially grown but provided with an appropriate dopant via in-situ doping. For example, to fabricate an NFET semiconductor device, the source/drain layer 240 may be provided with an N type (in-situ) dopant during epitaxial growth. Conversely, for a PFET semiconductor device, the source/drain layer 240 may be provided with a P type (in-situ) dopant during epitaxial growth.

Figure 3:
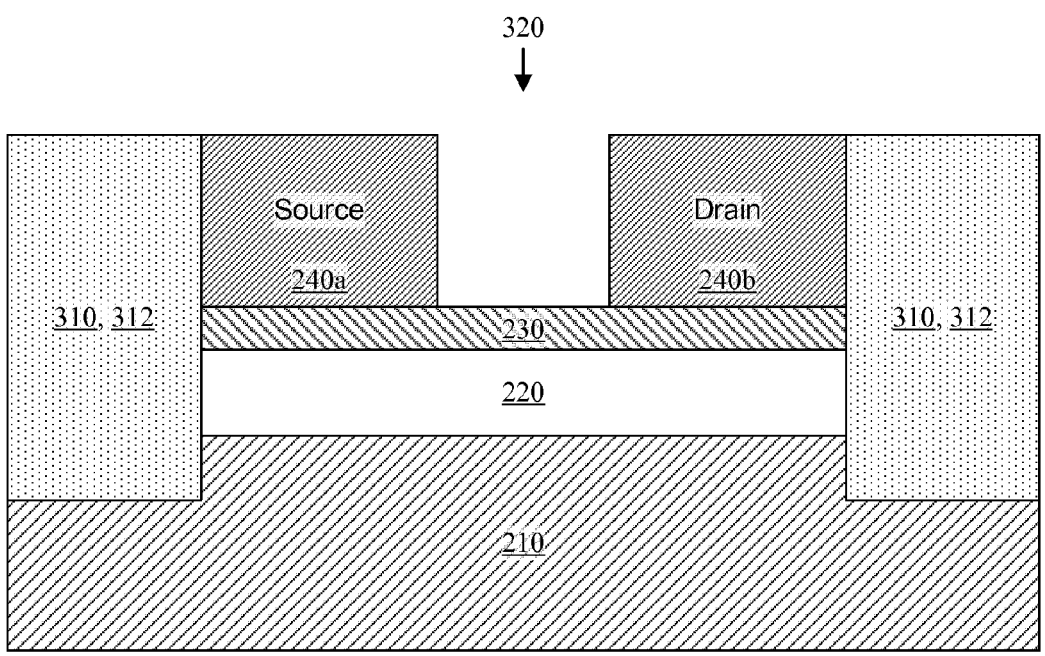

As shown in FIG. 3, one or more isolation trenches 310 may be formed on the device substrate 250. In one embodiment, the isolation trenches 310 are formed by etching away selected portions of the device substrate 250. In the depicted embodiment, the isolation trenches 310 extend into the bulk substrate 250 and are filled with an isolation material 312. Similar to the material for the barrier layer 220, the isolation material 312 may be an oxide such as $SiO_2$, HfO, ZrO, TaO, and the like.

In addition to forming the isolation trenches 310, FIG. 3 shows that a portion of the source/drain layer 240 may be removed to form a gate trench 320 that partitions the source/drain layer into a source 240a and a drain 240b.

Figure 4A:
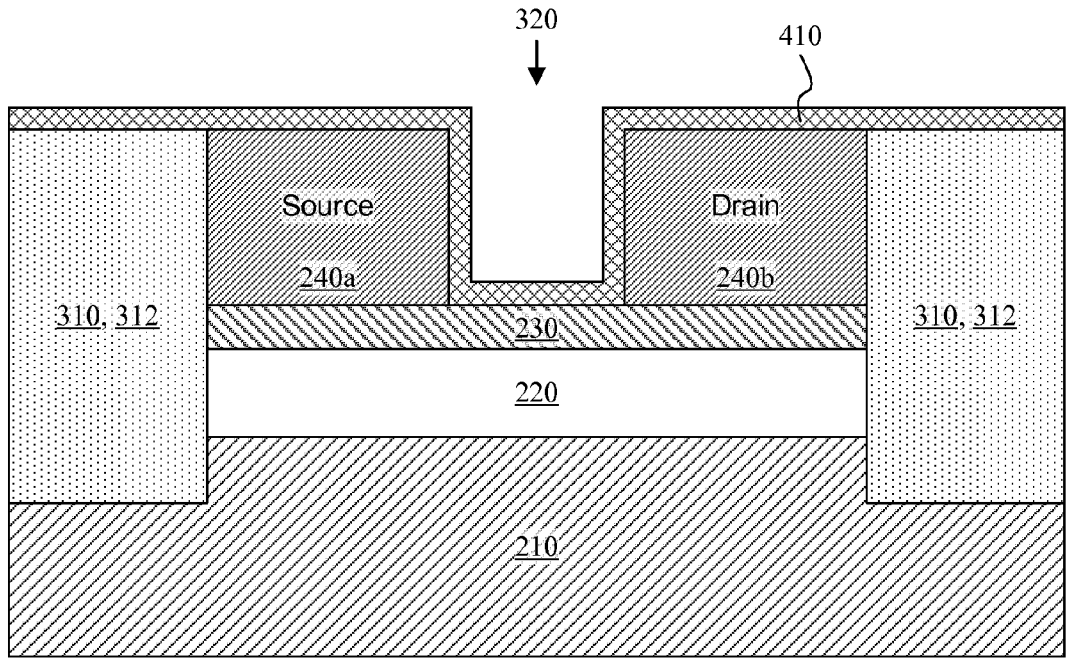
Figure 4B:
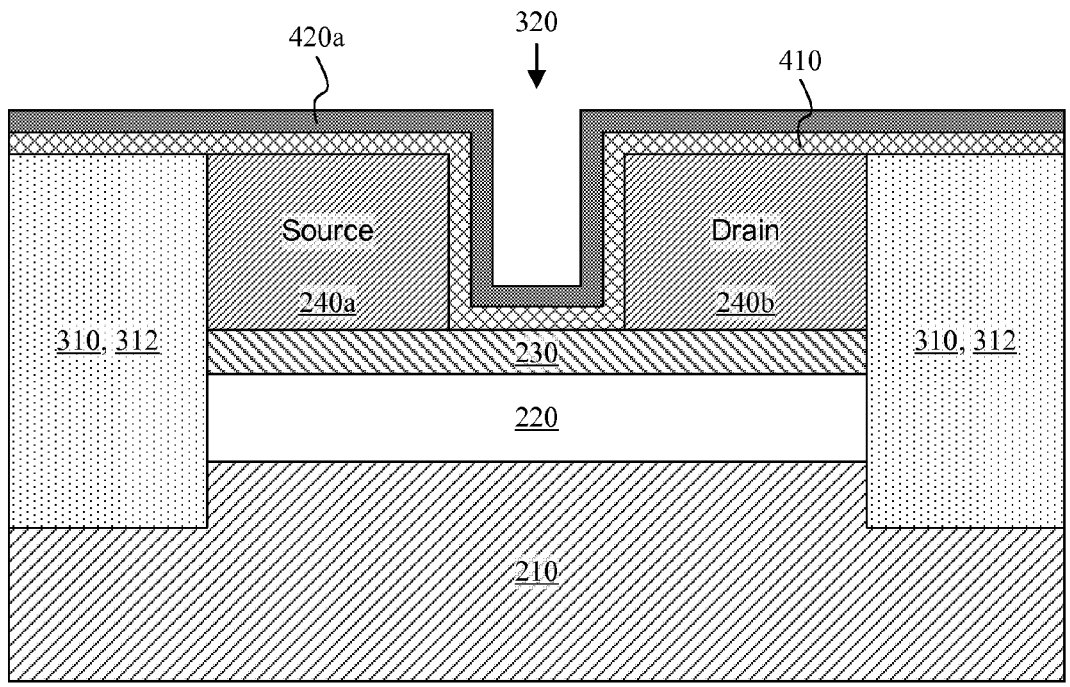
Figure 4C:
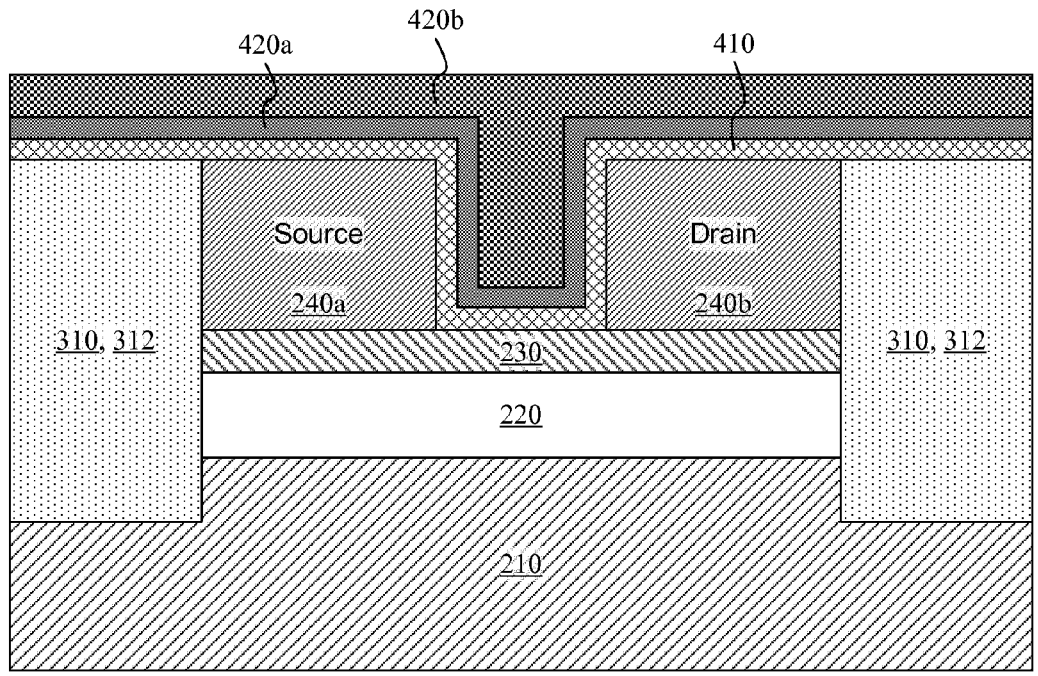

As shown in FIGS. 4A-4C, the bottom and sidewalls of the gate trench 320 may be covered with a gate dielectric layer 410 and one or more additional gate layers 420. The gate dielectric layer 410 may electrically isolate the additional gate layers 420 from the channel layer 230. For example, the gate dielectric layer 410 may be formed from a high-k material such as $HfSiO_4$, $ZrSiO_4$, $HfO_2$ and $ZrO_2$ that enables effective electrical isolation in shorter distances than traditional dielectrics such as $SiO_2$.

In the depicted embodiment, the additional gate layers 420 include a work function layer 420a and a gate conducting layer 420b. Examples of materials that can be used as a work function layer 420a include various metals that have a high work function such as TiN, TaN, W, and Al. Examples of materials that can be used in the gate conductor layer 420b include metals that are thermally stable and highly conductive such as Ir, Ni, Au, Co, Rh, and Re, and other metals.

In the depicted embodiment, the gate dielectric layers 410 and the additional gate layers 420 are deposited over the entire surface of the device substrate. In another embodiment, a patterned layer of photoresist (not shown) that is used to etch the gate trench 320, is kept in place while the gate dielectric layer 410 and the additional gate layers 420 are deposited. Removing the photoresist may also remove the portions of the gate dielectric layer 410 and the additional gate layers 420 that are outside of the gate trenches 320.

Figure 5:
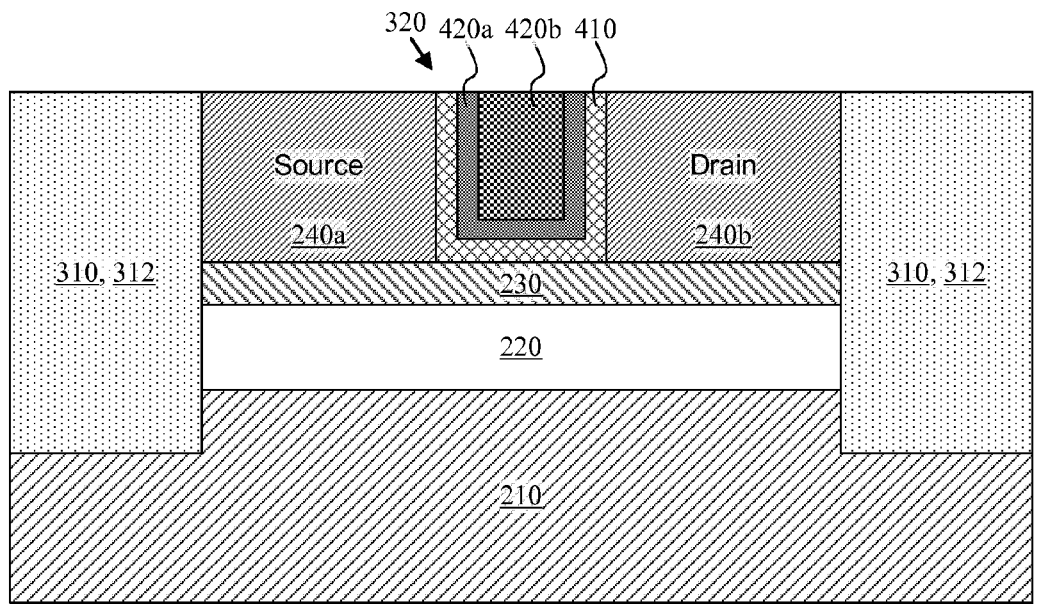

As shown in FIG. 5, the device substrate may undergo a chemical/mechanical polishing (CMP) process to planarize the device substrate and remove unwanted portions of (e.g., that lie outside of or above) the filled gate trench 320.

Figure 6A:
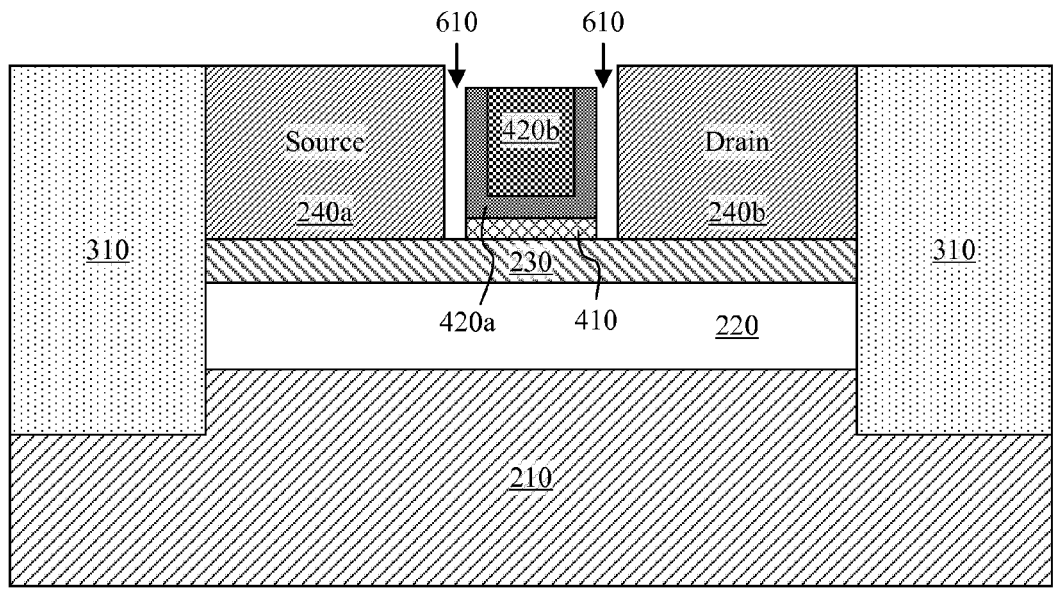
Figure 6B:
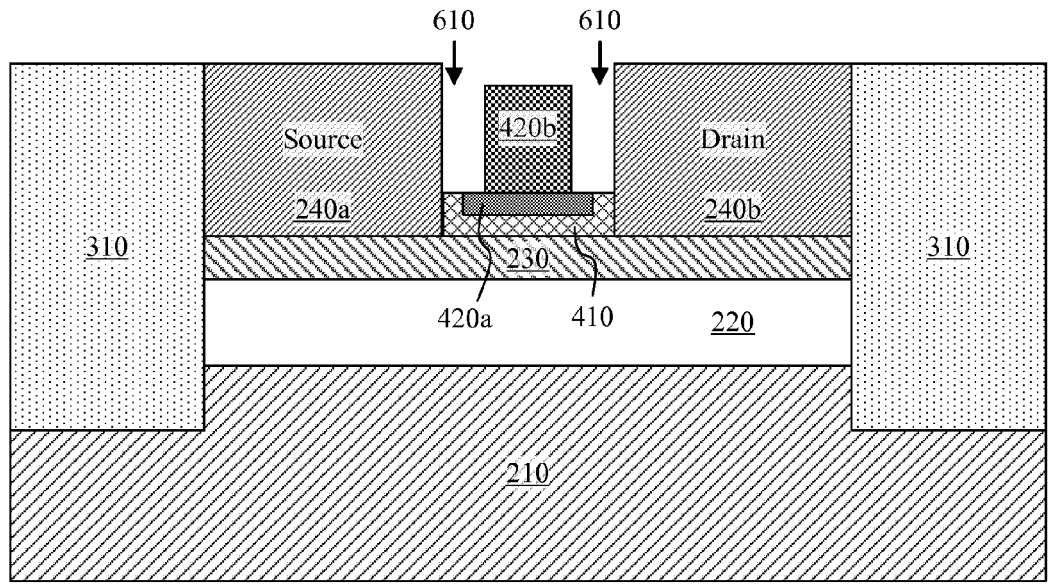

As shown in FIGS. 6A and 6B, at least the gate dielectric layer 410 may be substantially removed from the sidewalls of the gate trench 320 to provide a sidewall airgap 610. In the embodiment depicted in FIG. 6A, only the gate dielectric layer 410 is removed and the work function layer 420a and the gate conducting layer 420b remain substantially intact. In the embodiment depicted in FIG. 6B, the gate dielectric layer 410 and the work function layer 420a are substantially removed to provide a wider sidewall airgap 610 and only the gate conducting layer 420b remains substantially intact.

Figure 7A:
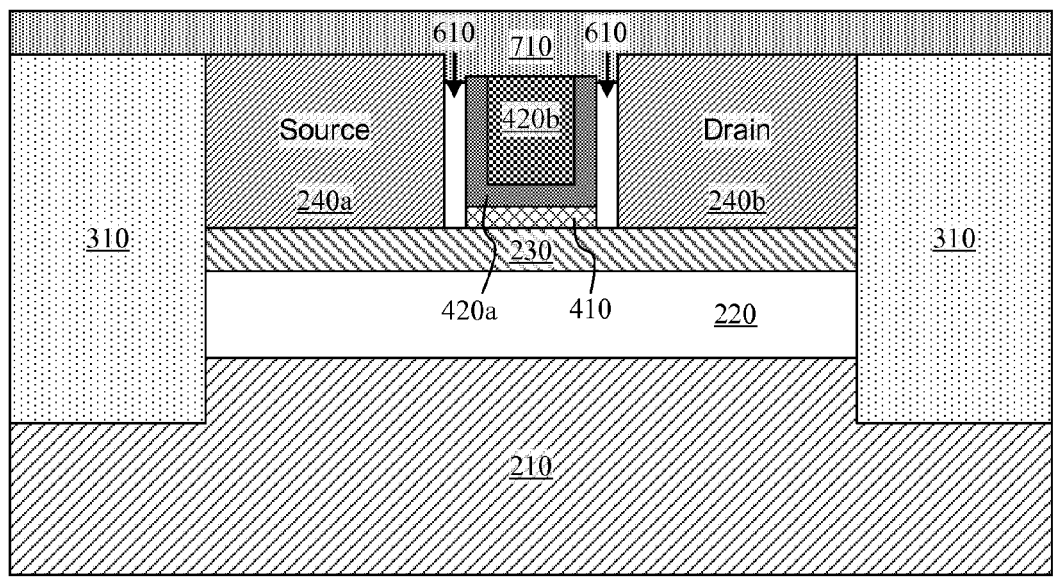
Figure 7B:
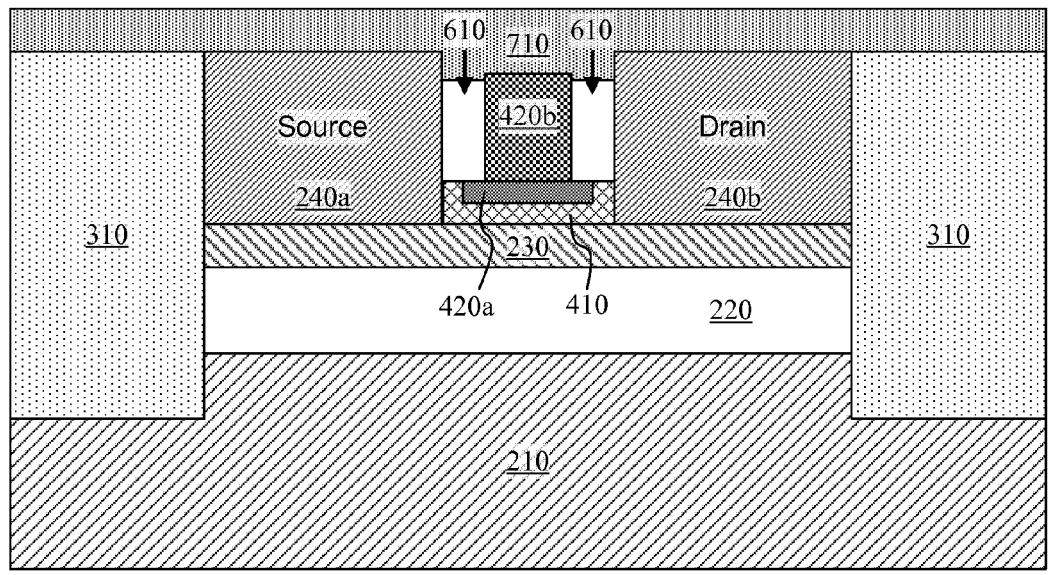

As shown in FIGS. 7A and 7B, a non-conformal capping layer 710 may be deposited over the device substrate 250 and the sidewall airgaps 610. The non-conformal capping layer 710 may electrically isolate the semiconductor devices (including the gate conducting layer 420b) from wiring layers and the like. In one embodiment, the capping layer 710 is formed by plasma enhanced CVD of a Nitride film. In some embodiments, the non-conformal capping layer 710 is also planarized via a CMP process.

In addition to the steps and operations disclosed herein, additional steps and operations may be performed while retaining the spirit and intent of the disclosed embodiments. Also, it should be noted that the apparatuses disclosed herein may be integrated with additional circuitry within integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method comprising:
   receiving a device substrate comprising a channel layer, and a source or drain layer;
   forming a gate trench within the source or drain layer of the device substrate;
   depositing a gate dielectric layer onto the bottom and sidewalls of the gate trench to form a narrower and shallower trench;
   depositing one or more conductive gate layers onto the bottom and sidewalls of the narrower and shallower trench; and
   removing a substantial portion of at least the gate dielectric layer from the sidewalls of the gate trench to form a left and a right sidewall airgap adjacent to the sidewalls of the gate trench.

2. The method of claim 1, wherein the one or more conductive gate layers comprise a work function layer.

3. The method of claim 1, wherein the one or more conductive gate layers comprise a gate conductor layer.

4. The method of claim 1, wherein forming the gate trench partitions the source or drain layer into a source and a drain.

5. The method of claim 1, further comprising planarizing the device substrate previous to removing the gate dielectric layer from the sidewalls of the gate trench.

6. The method of claim 1, wherein removing the gate dielectric layer from the sidewalls of the gate trench comprises conducting a low energy directional etching process.

7. The method of 1, wherein the gate dielectric layer comprises a material selected from the group consisting of HfSiO4, ZrSiO4, HfO2, ZrO2, SiO2, HfO, ZrO, and TaO.

8. The method of claim 1, wherein the device substrate is formed over a bulk substrate.

9. The method of claim 1, further comprising replacing a portion of the device substrate with an isolation trench that isolates adjacent semiconductor devices.

10. The method of claim 9, wherein the isolation trench is filled with an isolation material.

* * * * *